(12) United States Patent
Camacho et al.

(10) Patent No.: US 8,409,922 B2
(45) Date of Patent: Apr. 2, 2013

(54) SEMICONDUCTOR DEVICE AND METHOD OF FORMING LEADFRAME INTERPOSER OVER SEMICONDUCTOR DIE AND TSV SUBSTRATE FOR VERTICAL ELECTRICAL INTERCONNECT

(75) Inventors: Zigmund R. Camacho, Singapore (SG); Dioscoro A. Merilo, Singapore (SG); Henry D. Bathan, Singapore (SG); Emmanuel A. Espiritu, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 290 days.

(21) Appl. No.: 12/882,110

(22) Filed: Sep. 14, 2010

(65) Prior Publication Data

US 2012/0061814 A1 Mar. 15, 2012

(51) Int. Cl.
*H01L 21/00* (2006.01)
*H01L 23/495* (2006.01)

(52) U.S. Cl. ........ 438/109; 438/123; 438/124; 257/673; 257/686; 257/786; 257/E33.066; 257/E23.043

(58) Field of Classification Search ........................ None
See application file for complete search history.

(56) References Cited

U.S. PATENT DOCUMENTS

| 8,067,268 B2* | 11/2011 | Carson et al. | 438/109 |
|---|---|---|---|
| 8,076,184 B1* | 12/2011 | Camacho et al. | 438/123 |
| 8,105,872 B2* | 1/2012 | Pagaila et al. | 438/106 |
| 8,241,956 B2* | 8/2012 | Camacho et al. | 438/109 |
| 2009/0243073 A1* | 10/2009 | Carson et al. | 257/686 |
| 2010/0133665 A1 | 6/2010 | Ha et al. | |
| 2011/0278707 A1* | 11/2011 | Chi et al. | 257/676 |
| 2011/0298109 A1* | 12/2011 | Pagaila et al. | 257/660 |
| 2012/0168916 A1* | 7/2012 | Chi et al. | 257/659 |

\* cited by examiner

*Primary Examiner* — Alonzo Chambliss
(74) *Attorney, Agent, or Firm* — Robert D. Atkins; Patent Law Group: Atkins & Associates, P.C.

(57) ABSTRACT

A semiconductor device has a substrate with a plurality of conductive vias formed through the substrate and first conductive layer formed over the substrate. A first semiconductor die is mounted over the substrate. A second semiconductor die can be mounted over the first semiconductor die. A leadframe interposer has a base plate and a plurality of base leads extending from the base plate. An etch-resistant conductive layer is formed over a surface of the base plate opposite the base leads. The leadframe is mounted to the substrate over the first semiconductor die. An encapsulant is deposited over the substrate and first semiconductor die. The base plate is removed while retaining the etch-resistant conductive layer and portion of the base plate opposite the base leads to electrically isolate the base leads. An interconnect structure is formed over a surface of the substrate opposite the base leads.

31 Claims, 18 Drawing Sheets

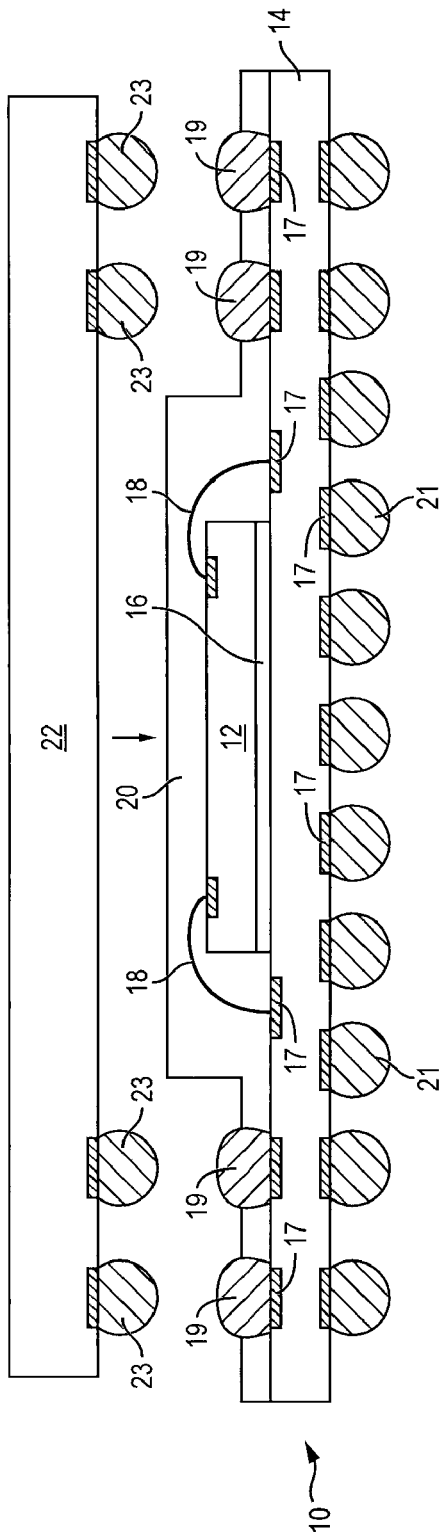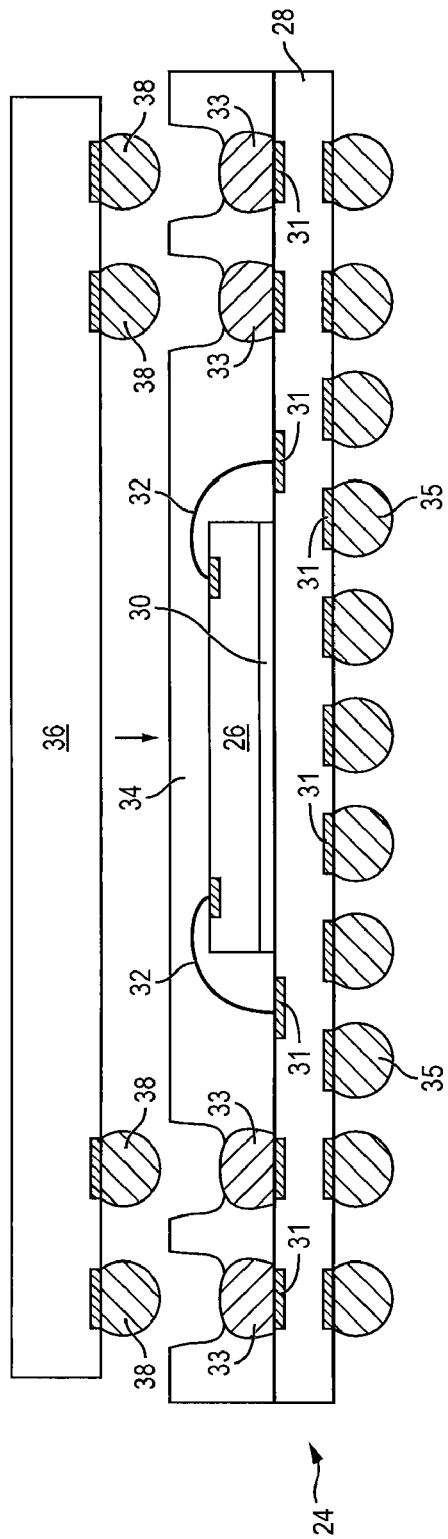
FIG. 1 (PRIOR ART)
FIG. 2 (PRIOR ART)

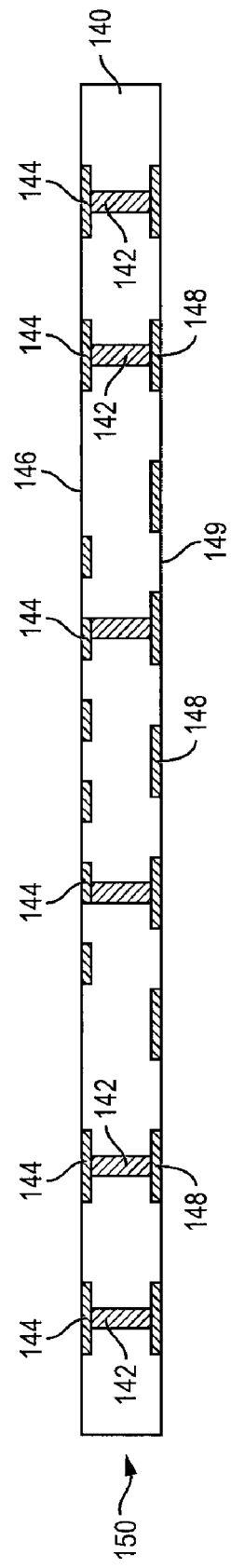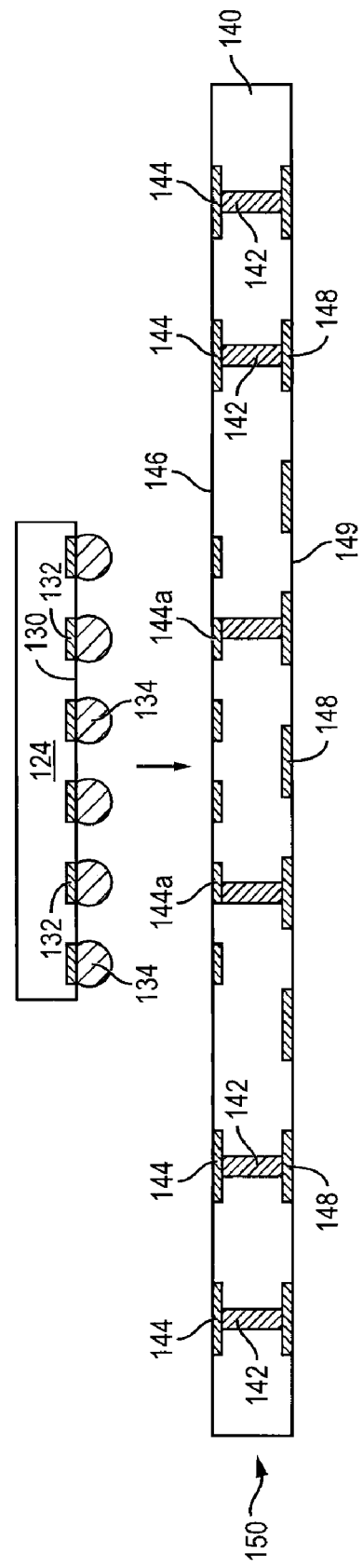

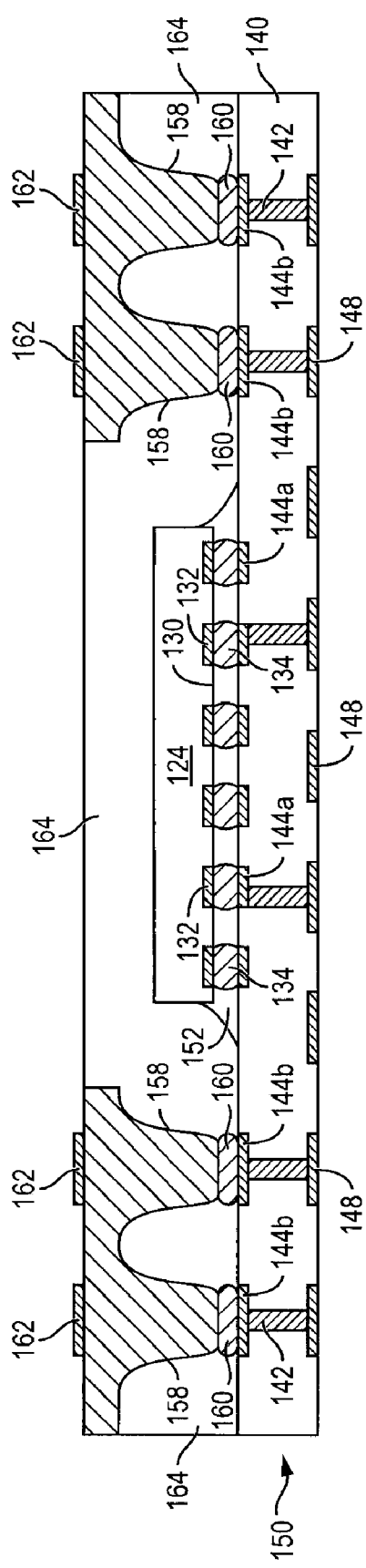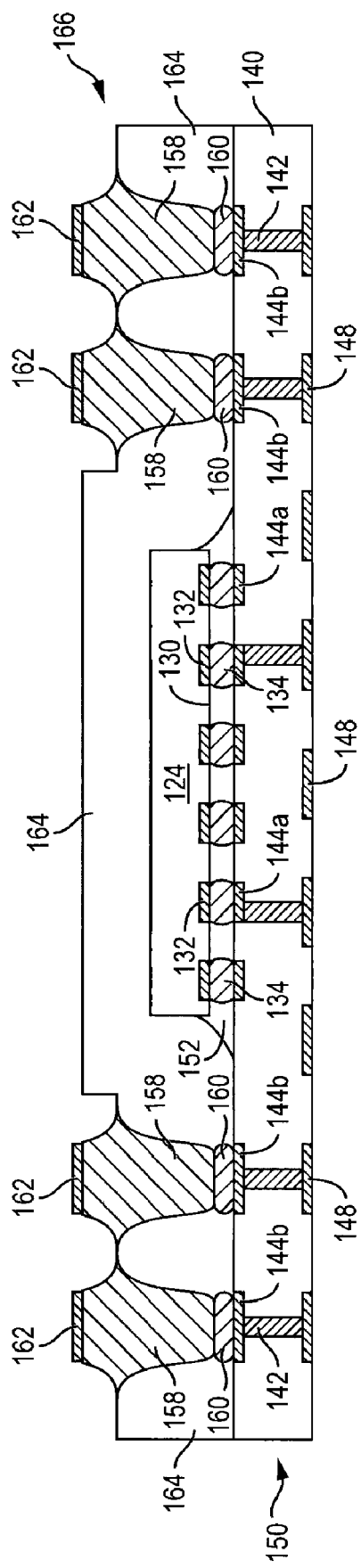

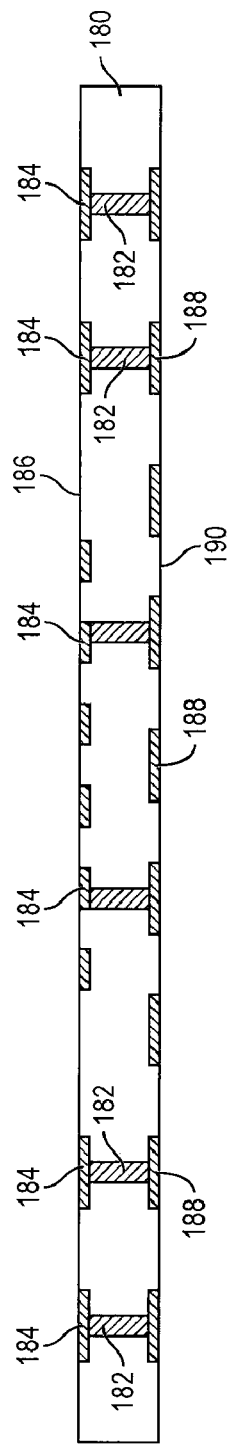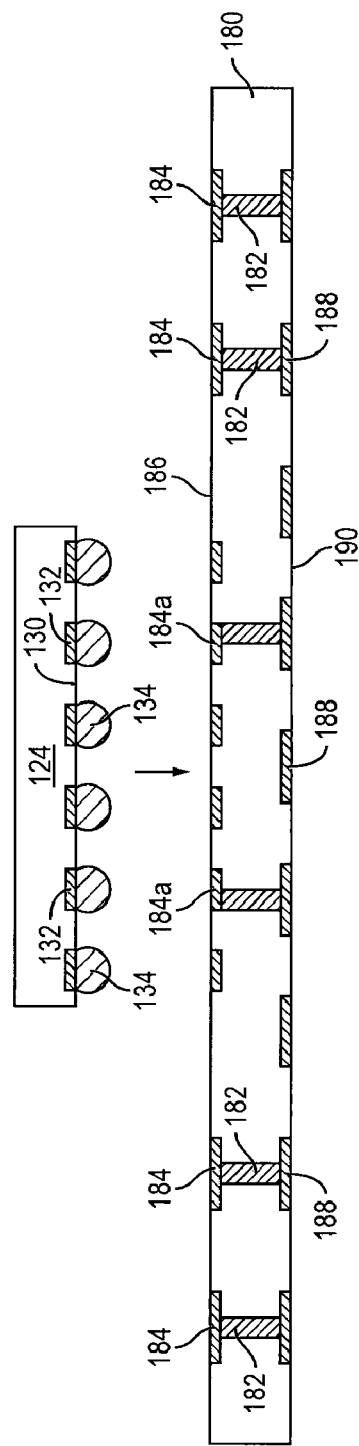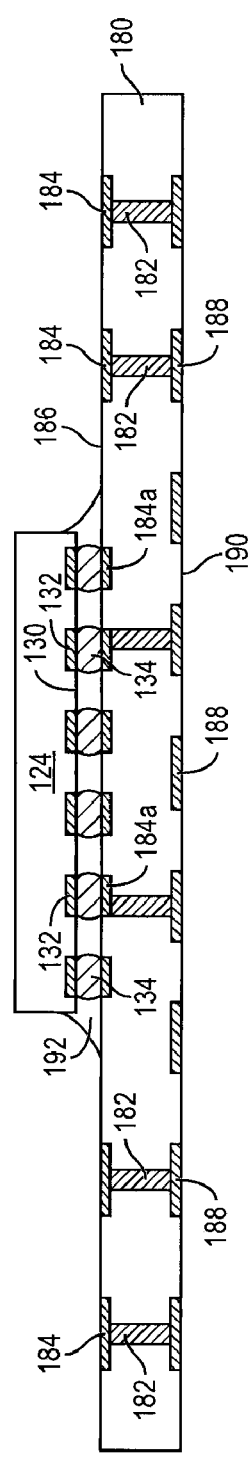
FIG. 7a
FIG. 7b
FIG. 7c

SEMICONDUCTOR DEVICE AND METHOD OF FORMING LEADFRAME INTERPOSER OVER SEMICONDUCTOR DIE AND TSV SUBSTRATE FOR VERTICAL ELECTRICAL INTERCONNECT

FIELD OF THE INVENTION

The present invention relates in general to semiconductor devices and, more particularly, to a semiconductor device and method of forming a leadframe interposer over a semiconductor die and TSV substrate for vertical electrical interconnect.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Many applications require a high level of functional integration, which can be achieved with a package-on-package (PoP). FIG. 1 shows a conventional PoP 10 with semiconductor die 12 mounted to substrate 14 with die attach adhesive 16. Semiconductor die 12 is electrically connected to contact pads 17 formed on substrate 16 with bond wires 18. Bumps 19 are formed on contact pads 17. An encapsulant 20 is deposited over semiconductor die 12 and substrate 16. Bumps 21 are also formed on contact pads 17 formed on an opposite surface of substrate 14. A portion of encapsulant 20 over bumps 19 is removed by a grinding process in order to mount semiconductor die 22. After the grinding operation, semiconductor die 22 can be mounted to encapsulant 20 with bumps 23 electrically connected to bumps 19.

FIG. 2 shows another conventional PoP 24 with semiconductor die 26 mounted to substrate 28 with die attach adhesive 30. Semiconductor die 26 is electrically connected to contact pads 31 formed on substrate 28 with bond wires 32. Bumps 33 are also formed on contact pads 31. An encapsulant 34 is deposited over semiconductor die 26 and substrate 28. Bumps 35 are formed on contact pads 31 formed on an opposite surface of substrate 28. A portion of encapsulant 34 over bumps 33 is removed by an etching process in order to mount semiconductor die 36. After the etching operating, semiconductor die 36 can be mounted to encapsulant 34 with bumps 38 electrically connected to bumps 33. The grinding and etching to make headroom for mounting an upper semiconductor die can induce stress and cause defects in the PoP.

SUMMARY OF THE INVENTION

A need exists to provide efficient stacking of semiconductor die and a vertical interconnect structure without inducing undue stress or defects in the semiconductor package. Accordingly, in one embodiment, the present invention is a method of making a semiconductor device comprising the steps of providing a substrate having a plurality of conductive vias formed through the substrate and first conductive layer formed over the substrate, mounting a first semiconductor die over the substrate, providing a leadframe having a base plate and a plurality of base leads extending from the base plate, forming an etch-resistant conductive layer over a surface of the base plate opposite the base leads, mounting the leadframe to the substrate over the first semiconductor die, depositing an encapsulant over the substrate and first semiconductor die, removing the base plate while retaining the etch-resistant conductive layer and portion of the base plate opposite the base leads to electrically isolate the base leads, and forming an interconnect structure over a surface of the substrate opposite the base leads.

In another embodiment, the present invention is a method of making a semiconductor device comprising the steps of providing a substrate, mounting a first semiconductor die over the substrate, providing an interposer having a base plate and a plurality of base leads extending from the base plate, forming a conductive layer over a surface of the base plate opposite the base leads, mounting the leadframe to the substrate over the first semiconductor die, depositing an encapsulant over the substrate and first semiconductor die, and removing the base plate while retaining the conductive layer and portion of the base plate opposite the base leads to electrically isolate the base leads.

In another embodiment, the present invention is a method of making a semiconductor device comprising the steps of providing a substrate, mounting a first semiconductor die over the substrate, providing an interposer having a base plate and a plurality of base leads extending from the base plate, mounting the leadframe to the substrate over the first semiconductor die, depositing an encapsulant over the substrate and first semiconductor die, and removing the base plate while retaining a portion of the base plate opposite the base leads to electrically isolate the base leads.

In another embodiment, the present invention is a semiconductor device comprising a substrate and first semiconductor die mounted over the substrate. An interposer has a base plate and a plurality of base leads extending from the base plate. The leadframe is mounted to the substrate over the first semiconductor die. An encapsulant is deposited over the substrate and first semiconductor die. The base plate is removed while retaining a portion of the base plate opposite the base leads to electrically isolate the base leads.

BRIEF DESCRIPTION OF THE DRAWINGS

FIG. 1 illustrates a conventional PoP formed by grinding the encapsulant to mount the upper semiconductor die;

FIG. 2 illustrates a conventional PoP formed by etching the encapsulant to mount the upper semiconductor die;

FIGS. 7a-7h illustrate a process of forming a leadframe interposer over a semiconductor die and BT laminate PCB for vertical electrical interconnect;

DETAILED DESCRIPTION OF THE DRAWINGS

Figure 3:
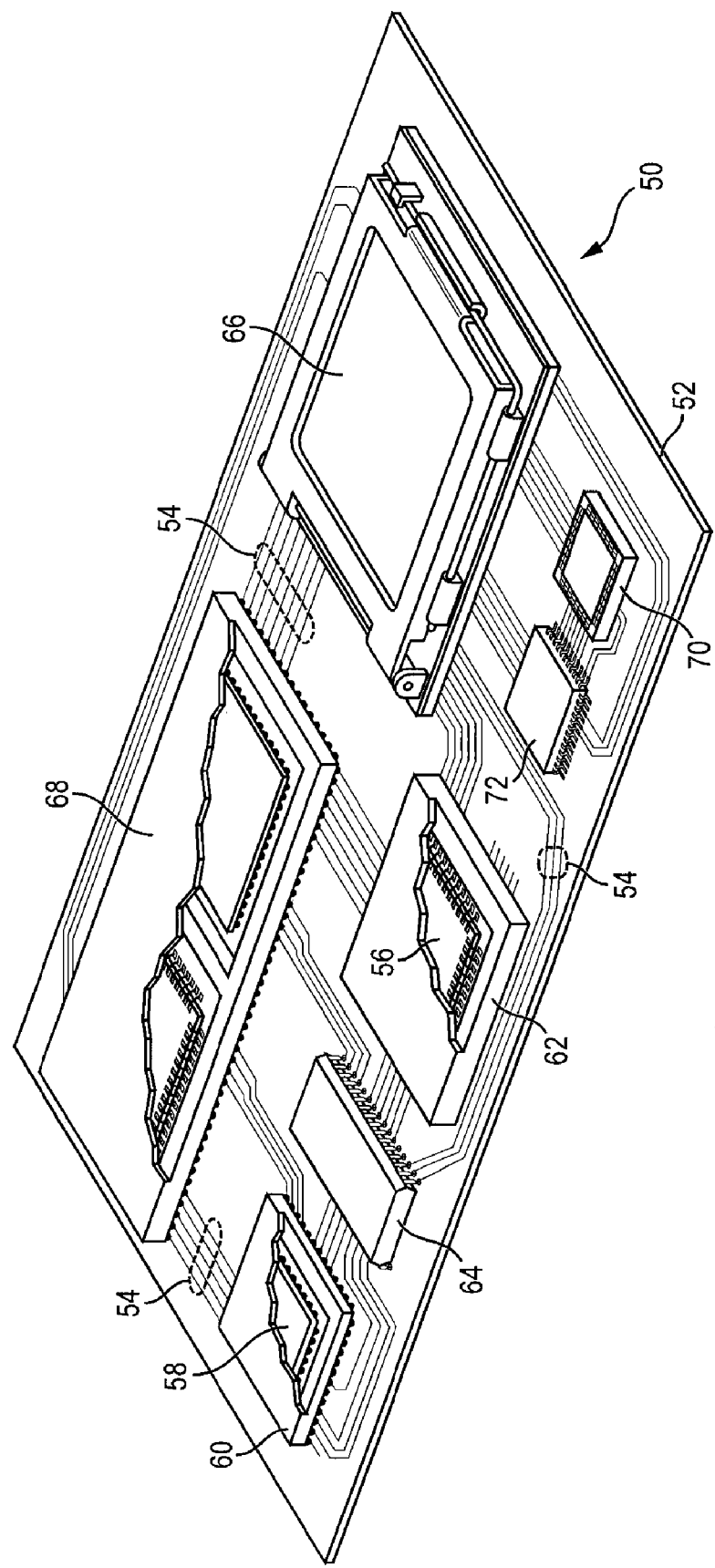
FIG. 3 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 3 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 3 for purposes of illustration.

Electronic device 50 may be a stand-alone system that uses the semiconductor packages to perform one or more electrical functions. Alternatively, electronic device 50 may be a sub-component of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 3, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 4A:
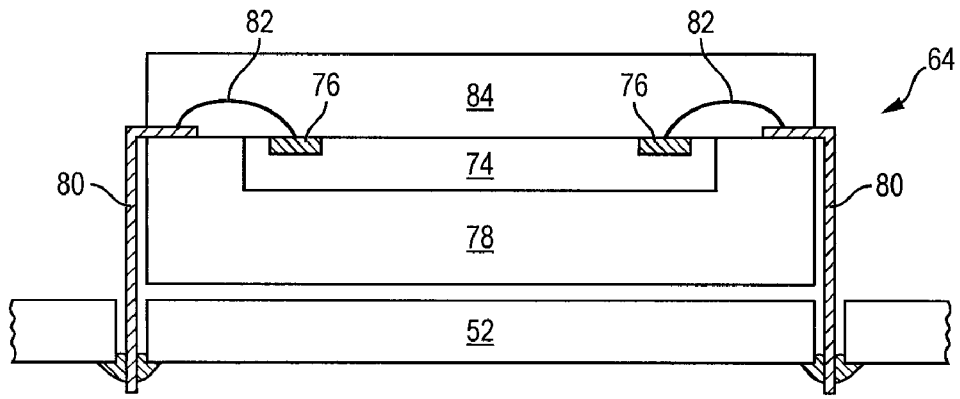
FIGS. 4a-4c illustrate further detail of the representative semiconductor packages mounted to the PCB.
Figure 4B:
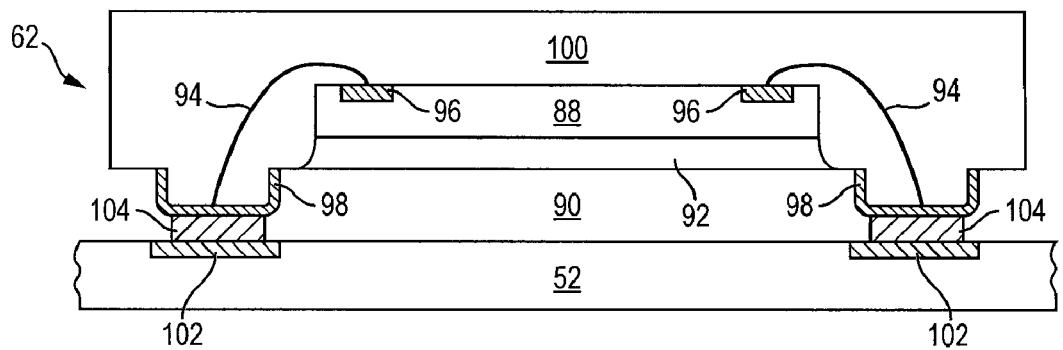
Figure 4C:
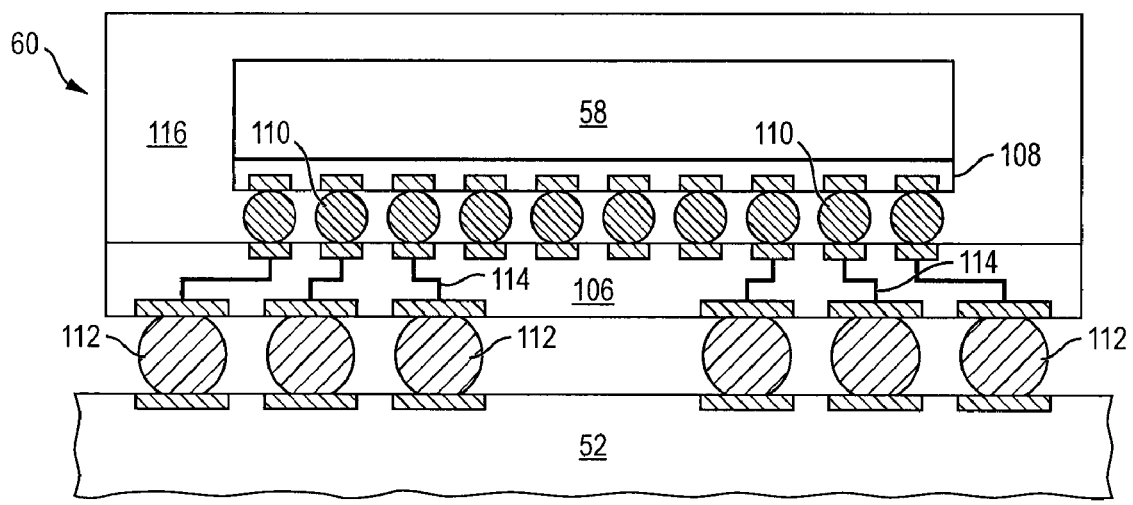

FIGS. 4a-4c show exemplary semiconductor packages. FIG. 4a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 4b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 4c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 5A:
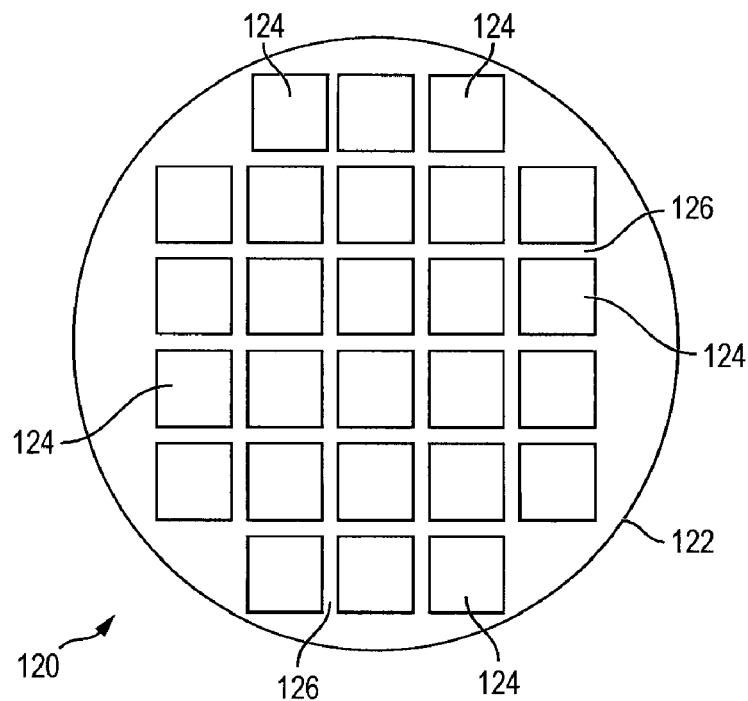
FIGS. 5a-5c illustrate a semiconductor wafer with a plurality of semiconductor die separated by saw streets.

FIG. 5a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126, as described above.

Figure 5B:
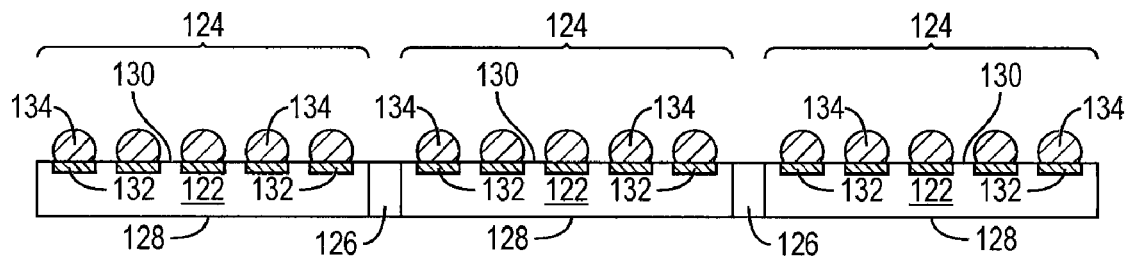

FIG. 5b shows a cross-sectional view of a portion of semiconductor wafer 120. Each semiconductor die 124 has a back surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Bumps 134 are formed over contact pads 132. In one embodiment, semiconductor die 124 is a flipchip type semiconductor die.

Figure 5C:
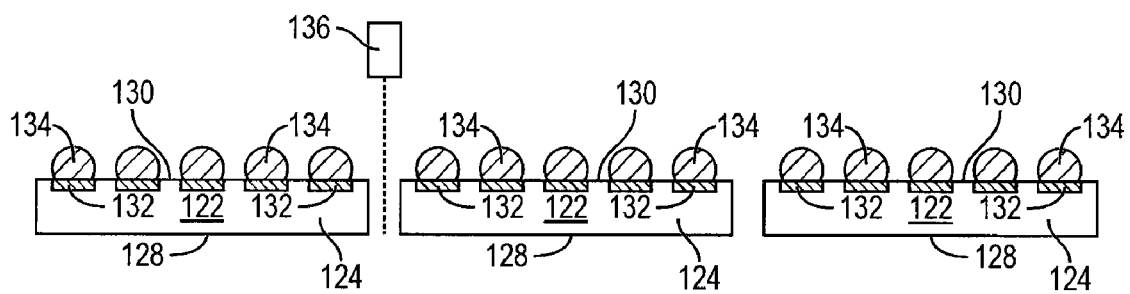

In FIG. 5c, semiconductor wafer 120 is singulated through saw street 126 using saw blade or laser cutting tool 136 into individual semiconductor die 124. Each semiconductor die 124 has bumps 134 formed over contact pads 132.

Figure 6D:
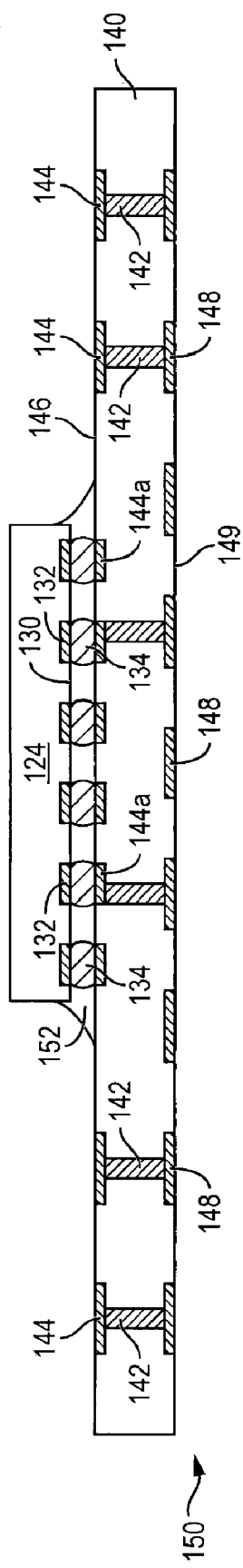
FIGS. 6a-6n illustrate a process of forming a leadframe interposer over a semiconductor die and TSV substrate for vertical electrical interconnect.
Figure 6E:
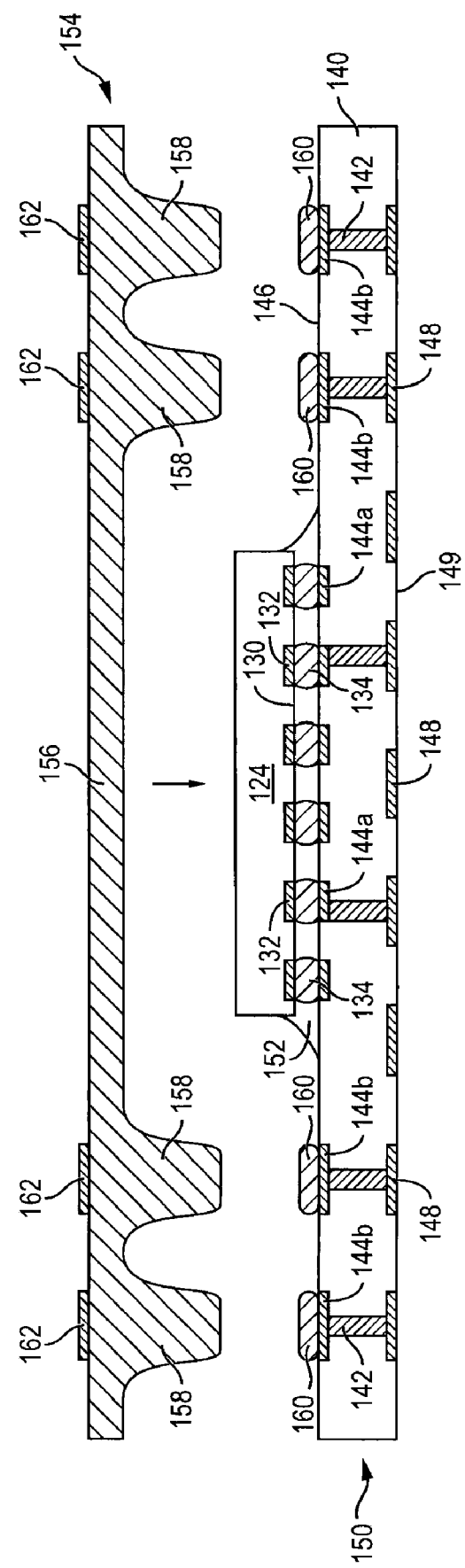
Figure 6F:
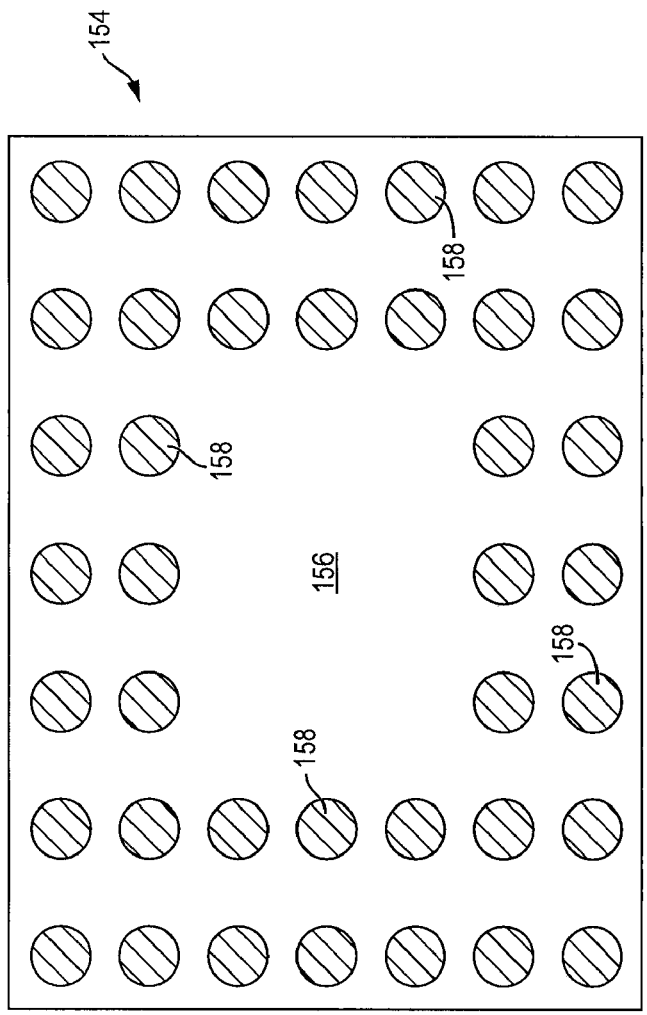
Figure 6G:
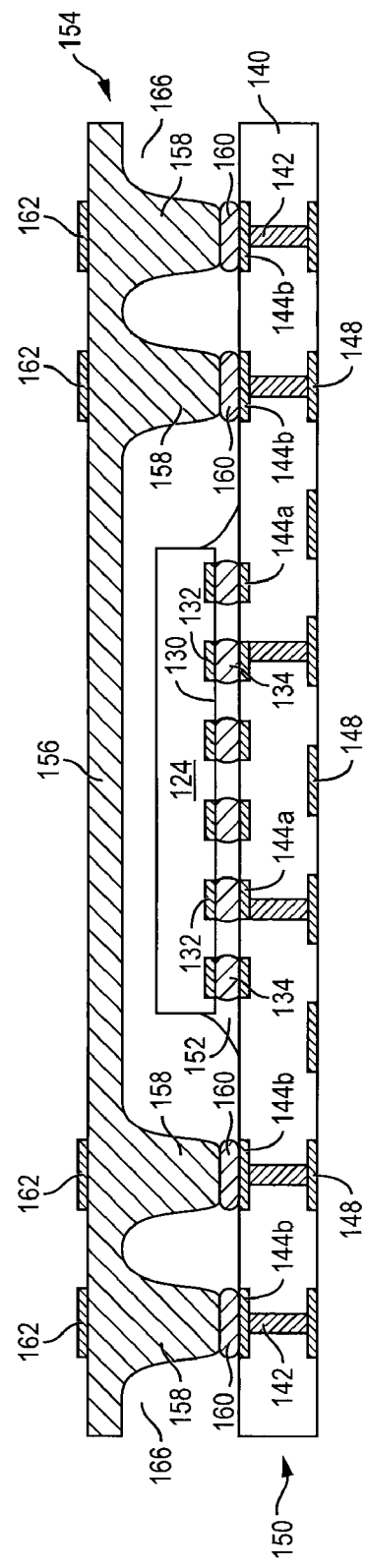
Figure 6H:
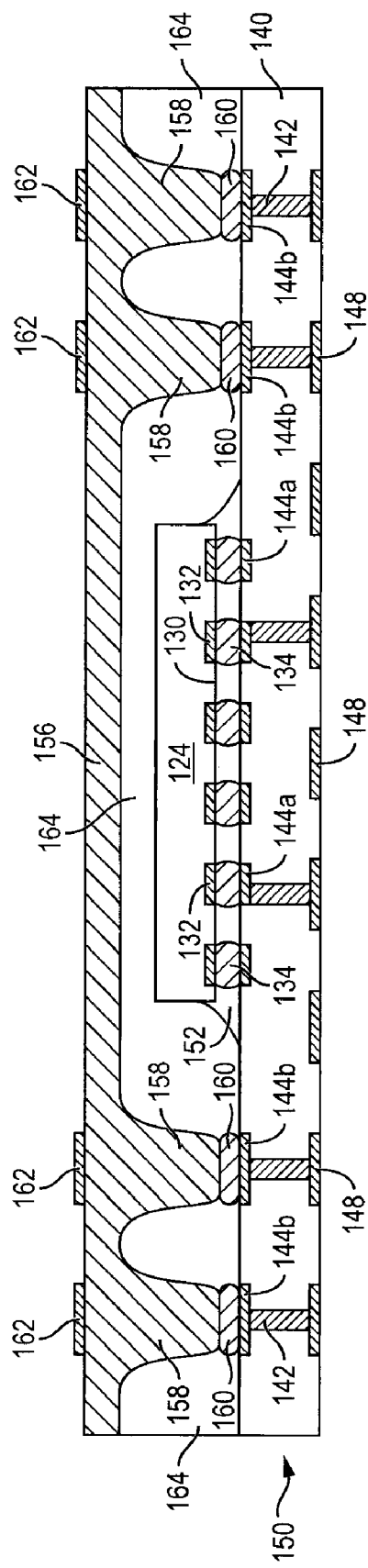
Figure 6I:
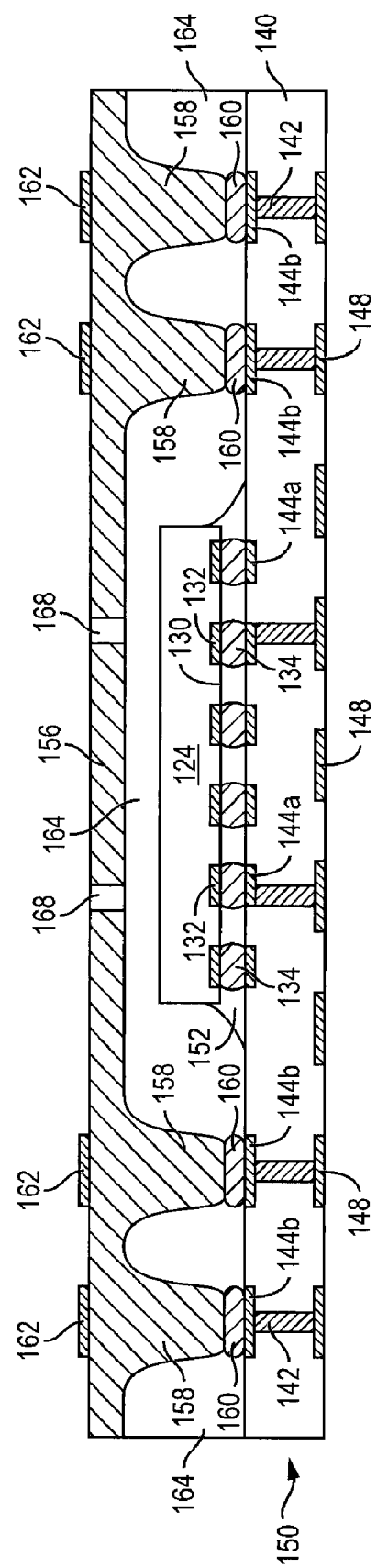
Figure 6J:
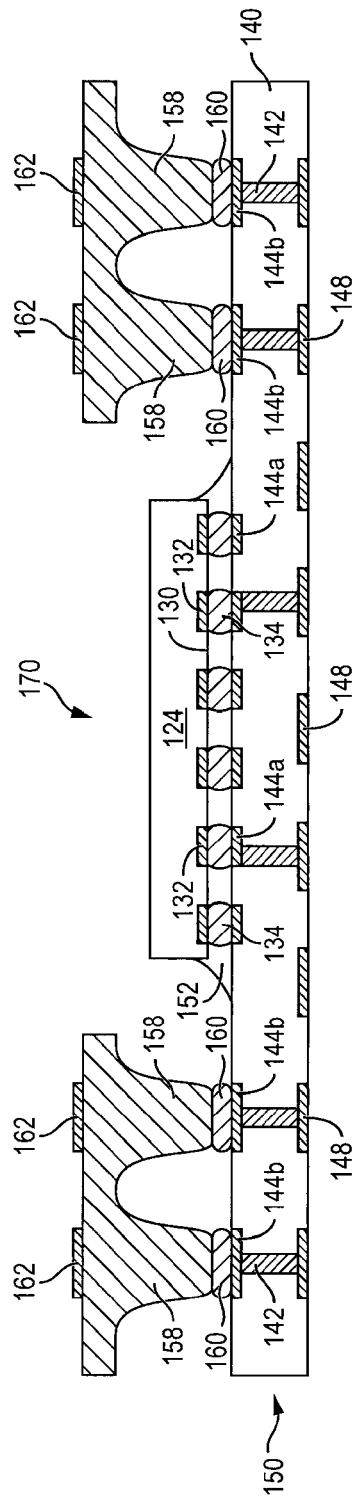
Figure 6K:
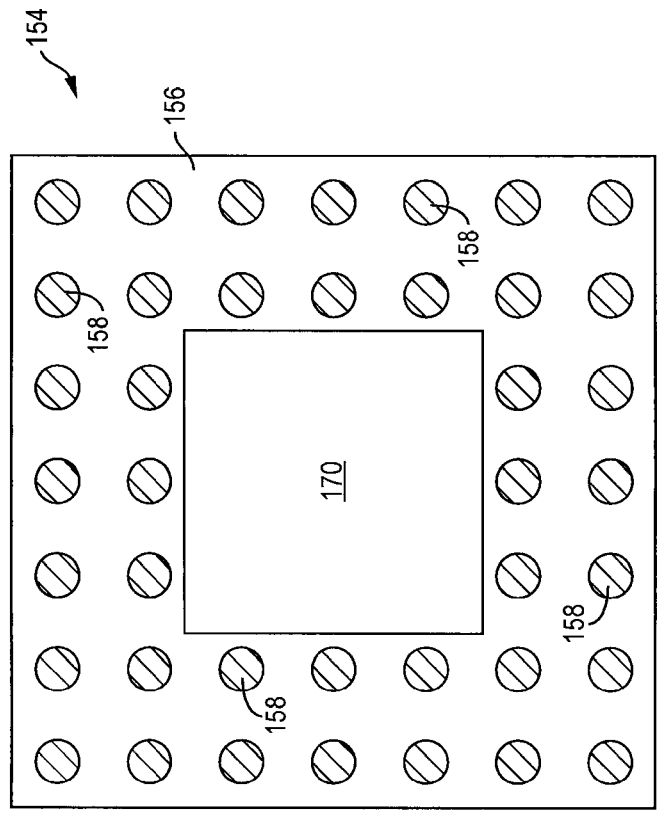
Figure 6N:
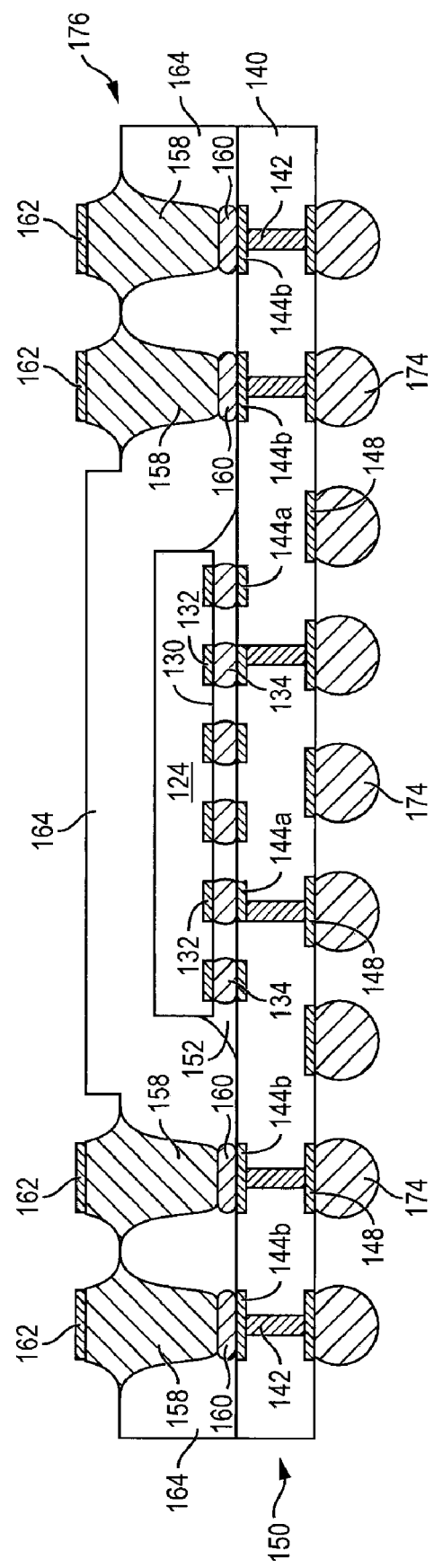

FIGS. 6a-6n illustrate, in relation to FIGS. 3 and 4a-4c, a process of forming a leadframe interposer over a semiconductor die and TSV substrate for vertical electrical interconnect in a Fo-WLCSP. In FIG. 6a, a semiconductor wafer or substrate 140 contains a base substrate material, such as silicon, germanium, gallium arsenide, indium phosphide, or silicon carbide, for structural support. In FIG. 6b, a plurality of vias is formed through semiconductor wafer 140 using mechanical drilling, laser drilling, or deep reactive ion etching (DRIE). The vias are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction conductive through silicon vias (TSV) 142.

An electrically conductive layer 144 is formed over surface 146 and electrically conductive layer 148 is formed over surface 149 of semiconductor wafer 140 using PVD, CVD, electrolytic plating, electroless plating process, or other suitable metal deposition process. Conductive layers 144 and 148 can be one or more layers of Al, Cu, Sn, Ni, Au, Ag, or other suitable electrically conductive material. Conductive layers 144 and 148 operate as contact pads for electrical interconnect. Conductive layers 144 and 148 also include redistribution layers (RDL) for routing signals across and through semiconductor wafer 140. Semiconductor wafer 140 with TSV 142 and conductive layers 144 and 148 constitute TSV wafer or substrate 150.

In FIG. 6c, semiconductor die 124 from FIGS. 5a-5c is mounted to TSV substrate 150 using a pick and place operation with active surface 130 oriented toward TSV substrate 150 and bumps 134 aligned to contact pads 144a. FIG. 6d shows semiconductor die 124 bonded to TSV substrate 150. An optional underfill material 152 is deposited under semiconductor die 124. Contact pads 144a can be wettable pads to enhance adhesion with bumps 134. FIG. 6c shows a portion of TSV substrate 150 associated with one semiconductor die. TSV substrate 150 extends beyond the dimensions shown in FIG. 6c for a wafer-level multi-die attachment.

FIG. 6e shows a wafer-form leadframe or interposer 154 having base plate 156 with integrated base leads or conductive bodies 158 extending from the base plate. FIG. 6f shows a plan view of leadframe 154 with base plate 156 and multiple rows of base leads 158. In one embodiment, leadframe 154 is an un-singulated pre-formed laminated substrate made with leadframe manufacturing techniques, such as stamping. Leadframe 154 can be gold, silver, nickel, platinum, copper, copper alloys (including one or more elements of nickel, iron, zinc, tin, chromium, silver, and phosphorous), or other suitable materials. In one embodiment, base plate 156 has a thickness of 0.05 millimeters (mm) and base leads 158 have a height of 0.2 mm, giving leadframe 154 a height of 0.25 mm. Base plate 156 is removed in a subsequent manufacturing step, e.g., before electrical testing. A solder paste and adhesive layer 160 is deposited over conductive layer 144b to bond with base leads 158 of leadframe 154. Leadframe 154 can be preplated (PPF) with conductive layer 162 over a surface of base plate 156 opposite base leads 158 as an external electrical interconnect site. Conductive layer 162 contains an etch-resistant or etch-stop material, such as Ag or Au.

Leading with base leads 158, leadframe 154 is aligned over conductive layer 144b to position base leads 158 around a perimeter of semiconductor die 124. FIG. 6g shows leadframe 154 mounted over semiconductor die 124 and secured in place with base leads 158 adhering to solder paste or adhesive layer 160. The height of base leads 158 is greater than the thickness of semiconductor die 124 and bumps 134.

In FIG. 6h, an encapsulant or molding compound 164 is deposited between leadframe 154 and TSV substrate 150 and semiconductor die 124 and around base leads 158 using a paste printing, compressive molding, transfer molding, liquid encapsulant molding, vacuum lamination, spin coating, or other suitable applicator. Encapsulant 164 can be polymer composite material, such as epoxy resin with filler, epoxy acrylate with filler, or polymer with proper filler. Encapsulant 164 can be deposited through side openings 166 of leadframe 154 with vacuum assist. Encapsulant 164 is non-conductive and environmentally protects the semiconductor device from external elements and contaminants.

FIG. 6i shows another embodiment with encapsulant 164 deposited through optional openings 168 formed in base plate 156.

FIG. 6j shows an embodiment with a portion of base plate 156 over semiconductor die 124 removed by an etching process to form window 170. FIG. 6k is a plan view of leadframe 154 with window 170 in base plate 156 and multiple rows of base leads 158. In FIG. 6l, encapsulant 164 is deposited through window 170 over TSV substrate 150 and semiconductor die 124 and around base leads 158.

In FIG. 6m, base plate 156 from FIG. 6h (or the remaining base plate 156 of FIG. 6l) is removed by an etching or grinding process to electrically isolate base leads 158. The portion of base plate 156 above base leads 158 remains due to the etch-resistant property of conductive layer 162. The electrically isolated base leads 158 constitute z-direction vertical interconnect structure or conductive pillars extending from conductive layer 144b of TSV substrate 150 through encapsulant 164 for external electrical interconnect.

In FIG. 6n, an electrically conductive bump material is deposited over conductive layer 148 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 148 using a suitable attachment or bonding process. In one embodiment, the bump material is reflowed by heating the material above its melting point to form spherical balls or bumps 174. In some applications, bumps 174 are reflowed a second time to improve electrical contact to conductive layer 148. An under bump metallization (UBM) can be formed under bumps 174. The bumps can also be compression bonded to conductive layer 148. Bumps 174 represent one type of interconnect structure that can be formed over conductive layer 148. The interconnect structure can also use stud bump, micro bump, or other electrical interconnect.

TSV substrate 150 is singulated through encapsulant 164 with saw blade or laser cutting tool into individual Fo-WLCSP 176. Semiconductor die 124 is electrically connected through contact pads 132 and bumps 134 to TSV substrate 150 and base leads 158. Leadframe 154 provides a simple and cost effective structure for vertical interconnect of semiconductor die 124, as well as efficient package stacking with the vertical clearance or headroom with base leads 158. Leadframe 154 provides a balanced structure and reduces warpage. In addition, PPF conductive layer 162 serves as an etch stop when removing base plate 156 to form base leads 158.

Figure 7D:
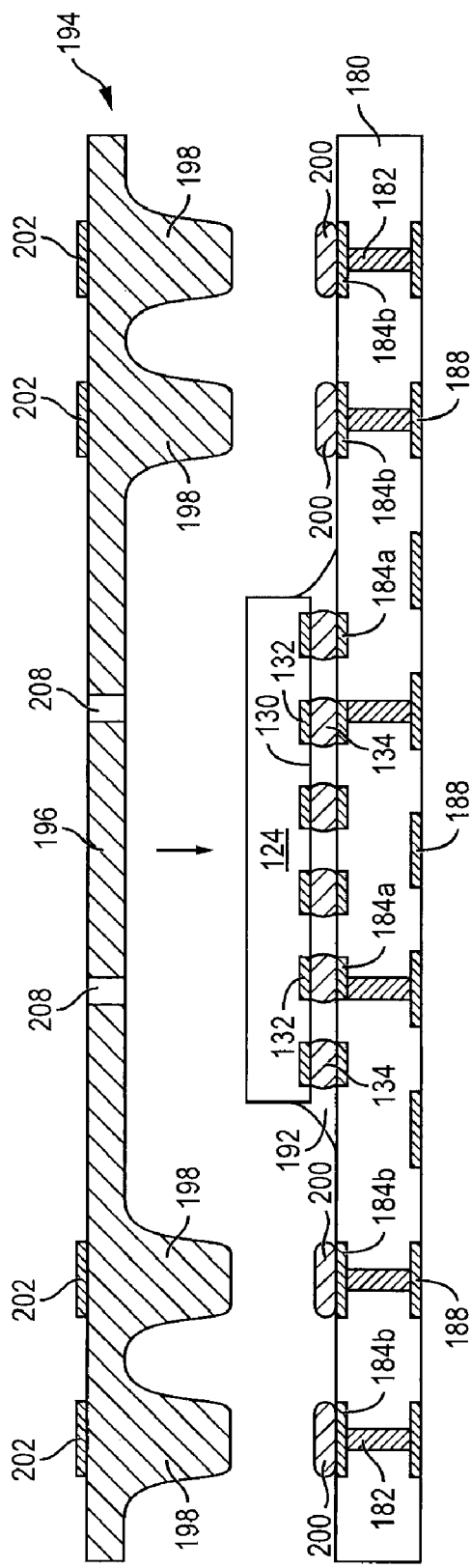

FIGS. 7a-7h illustrate, in relation to FIGS. 3 and 4a-4c, forming a leadframe interposer over a semiconductor die and BT laminate PCB for vertical electrical interconnect in a Fo-WLCSP. In FIG. 7a, a PCB 180 contains bismaleimide/triazine (BT) laminate and epoxy resin for structural support. A plurality of vias is formed through PCB 180 using mechanical drilling, laser drilling, or DRIE. The vias are filled with Al, Cu, Sn, Ni, Au, Ag, Ti, W, poly-silicon, or other suitable electrically conductive material using electrolytic plating, electroless plating process, or other suitable metal deposition process to form z-direction conductive vias 182.

An electrically conductive layer 184 is formed over surface 186 and electrically conductive layer 188 is formed over surface 190 of PCB 180 using BT laminate, electrolytic plating, electroless plating process, or other suitable metal deposition process. Conductive layers 184 and 188 can be one or more layers of Al, Cu, Sn, Ni, Au, Ag, or other suitable electrically conductive material. Conductive layers 184 and 188 operate as contact pads for electrical interconnect. Conductive layers 184 and 188 also include RDL for routing signals across and through PCB 180.

In FIG. 7b, semiconductor die 124 from FIGS. 5a-5c is mounted to PCB 180 using a pick and place operation with active surface 130 oriented toward PCB 180 and bumps 134 aligned to contact pads 184a. FIG. 7c shows semiconductor die 124 bonded to PCB 180. An optional underfill material 192 is deposited under semiconductor die 124. Contact pads 184a can be wettable pads to enhance adhesion with bumps 134. FIG. 7c shows a portion of PCB 180 associated with one semiconductor die. PCB 180 extends beyond the dimensions shown in FIG. 7c for a wafer-level multi-die attachment.

FIG. 7d shows a wafer-form leadframe or interposer 194 having base plate 196 with integrated base leads or conductive bodies 198 extending from the base plate. Leadframe 194 contains multiple rows of base leads 198, similar to FIG. 6f. In one embodiment, leadframe 194 is an un-singulated preformed laminated substrate made with leadframe manufacturing techniques, such as stamping. Leadframe 194 can be gold, silver, nickel, platinum, copper, copper alloys (including one or more elements of nickel, iron, zinc, tin, chromium, silver, and phosphorous), or other suitable materials. In one embodiment, base plate 196 has a thickness of 0.05 mm and base leads 198 have a height of 0.2 mm, giving leadframe 194 a height of 0.25 mm. Base plate 196 is removed in a subsequent manufacturing step, e.g., before electrical testing. A solder paste and adhesive layer 200 is deposited over conductive layer 184b to bond with base leads 198 of leadframe 194. Leadframe 194 can be PPF with conductive layer 202 over a surface of base plate 196 opposite base leads 198 as an external electrical interconnect site. Conductive layer 202 contains an etch-resistant or etch-stop material, such as Ag or Au.

Figure 7E:
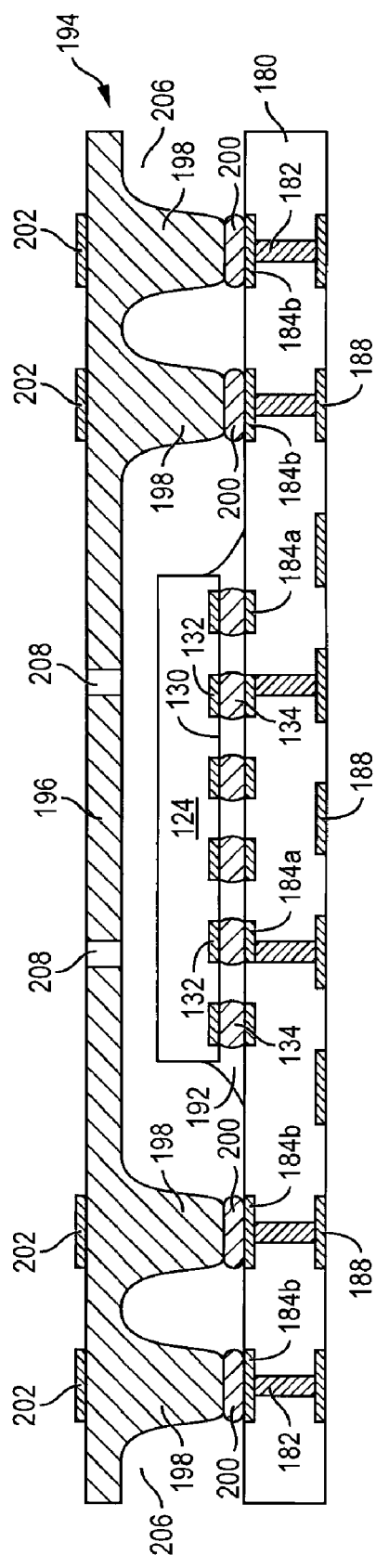

Leading with base leads 198, leadframe 194 is aligned over conductive layer 184b to position base leads 198 around a perimeter of semiconductor die 124. FIG. 7e shows leadframe 194 mounted over semiconductor die 124 and secured in place with base leads 198 adhering to solder paste or adhesive layer 200. The height of base leads 198 is greater than the thickness of semiconductor die 124 and bumps 134.

Figure 7F:
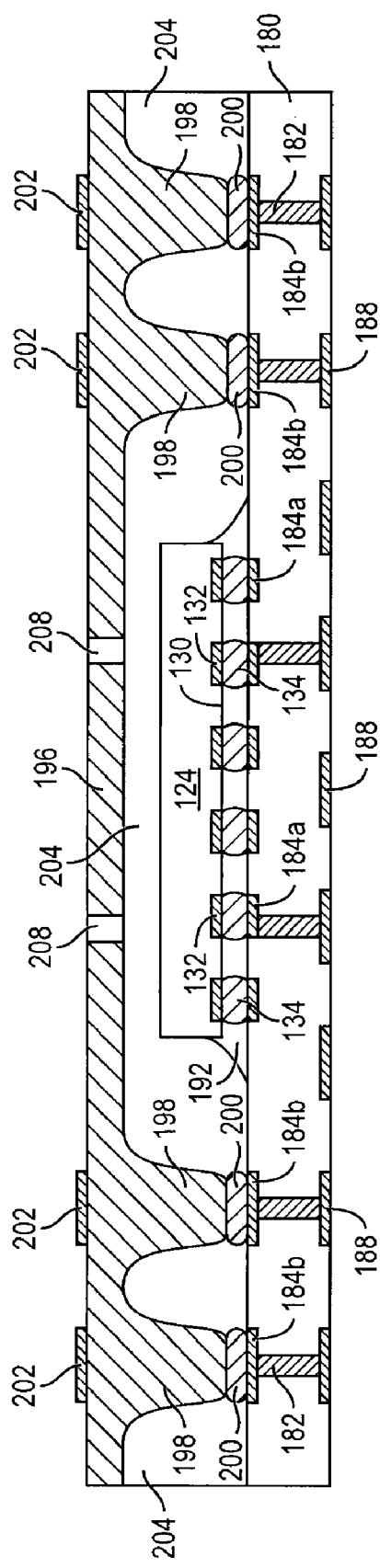

In FIG. 7f, an encapsulant or molding compound 204 is deposited between leadframe 194 and PCB 180 and semiconductor die 124 and around base leads 198 using a paste printing, compressive molding, transfer molding, liquid encapsulant molding, vacuum lamination, spin coating, or other suitable applicator. Encapsulant 204 can be polymer composite material, such as epoxy resin with filler, epoxy acrylate with filler, or polymer with proper filler. Encapsulant 204 can be deposited through side openings 206 of leadframe 194 with vacuum assist. Alternatively, encapsulant 204 can be deposited through openings 208 formed in base plate 196. Encapsulant 204 is non-conductive and environmentally protects the semiconductor device from external elements and contaminants.

In another embodiment, a portion of base plate 196 over semiconductor die 124 is removed by an etching process to form a window, similar to FIG. 6i. Encapsulant 204 is deposited through the window over PCB 180 and semiconductor die 124 and around base leads 198.

Figure 7G:
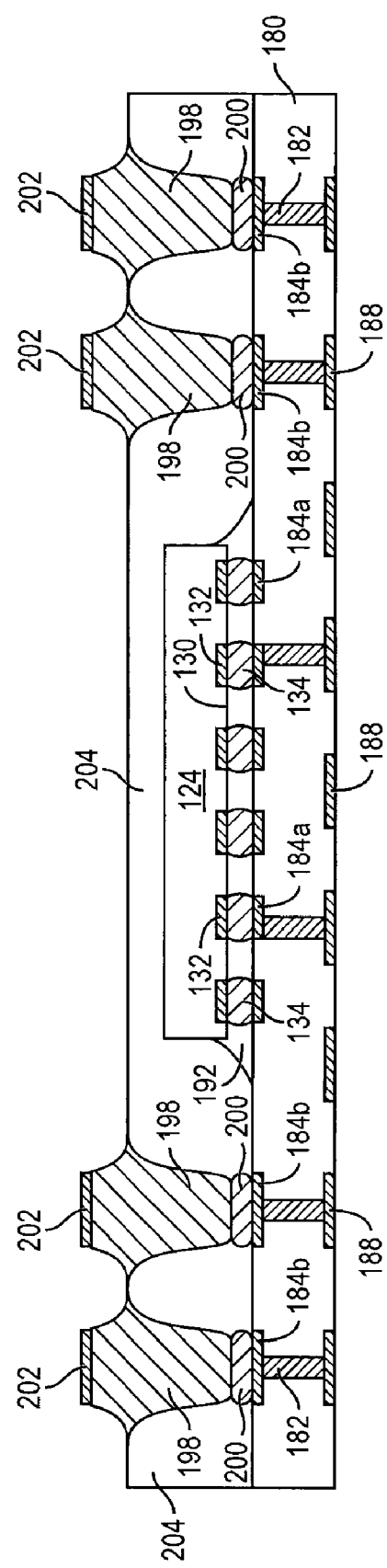

In FIG. 7g, base plate 196 is removed by an etching or grinding process to electrically isolate base leads 198. The portion of base plate 196 above base leads 198 remains due to the etch-resistant properties of conductive layer 202. The electrically isolated base leads 198 constitute z-direction vertical interconnect structure or conductive pillars extending from conductive layer 184b of PCB 180 through encapsulant 204 for external electrical interconnect.

Figure 7H:
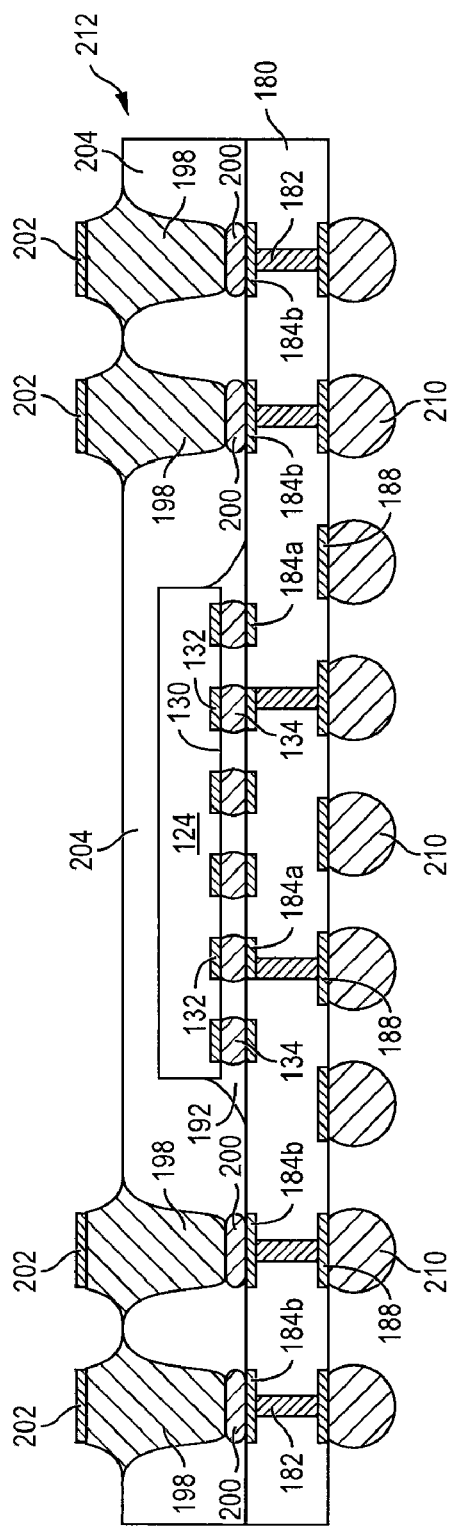

In FIG. 7h, an electrically conductive bump material is deposited over conductive layer 188 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 188 using a suitable attachment or bonding process. In one embodiment, the bump material is reflowed by heating the material above its melting point to form spherical balls or bumps 210. In some applications, bumps 210 are reflowed a second time to improve electrical contact to conductive layer 188. A UBM can be formed under bumps 210. The bumps can also be compression bonded to conductive layer 188. Bumps 210 represent one type of interconnect structure that can be formed over conductive layer 188. The interconnect structure can also use stud bump, micro bump, or other electrical interconnect.

PCB 180 is singulated through encapsulant 204 with saw blade or laser cutting tool into individual Fo-WLCSP 212. Semiconductor die 124 is electrically connected through contact pads 132 and bumps 134 to PCB 180 and base leads 198. Leadframe 194 provides a simple and cost effective structure for vertical interconnect of semiconductor die 124, as well as efficient package stacking with the vertical clearance or headroom with base leads 198. Leadframe 194 provides a balanced structure and reduces warpage. In addition, PPF conductive layer 202 serves as an etch stop when removing base plate 196 to form base leads 198.

Figure 8:
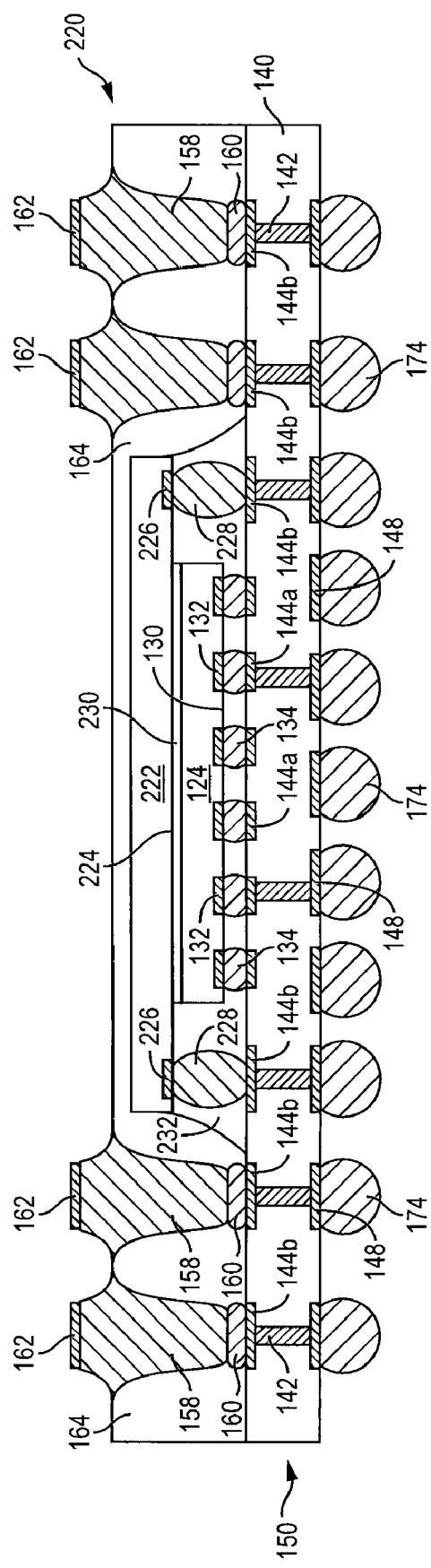
FIG. 8 illustrates the Fo-WLCSP with a leadframe interposer disposed over stacked semiconductor die and TSV substrate for vertical electrical interconnect.

FIG. 8 shows an embodiment of Fo-WLCSP 220, similar to FIGS. 6a-6m, with stacked semiconductor die embedded within encapsulant 164. Semiconductor die 222 has an active surface 224 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 224 to implement analog circuits or digital circuits, such as DSP, ASIC, memory, or other signal processing circuit. Semiconductor die 222 may also contain IPDs, such as inductors, capacitors, and resistors, for RF signal processing. In one embodiment, semiconductor die 222 is a flipchip type semiconductor die. Contact pads 226 are formed on active surface 224 and electrically connected to the circuits on the active surface. A plurality of bumps 228 is formed over contact pads 226.

Semiconductor die 222 is mounted active surface-to-back surface to semiconductor die 124 with b-stage coating 230, prior to mounting leadframe 154 in FIGS. 6e-6g. Bumps 228 are metallurgically and electrically connected to conductive layer 144b. An optional underfill material 232 is deposited under semiconductor die 124 and 222. Encapsulant 164 covers semiconductor die 124 and 222, as described in FIGS. 6h-6k. Base leads 158, TSV substrate 150, and bumps 174 provide z-direction vertical electrical interconnect for semiconductor die 124 and 222, as described in FIGS. 6l-6m.

Figure 9:
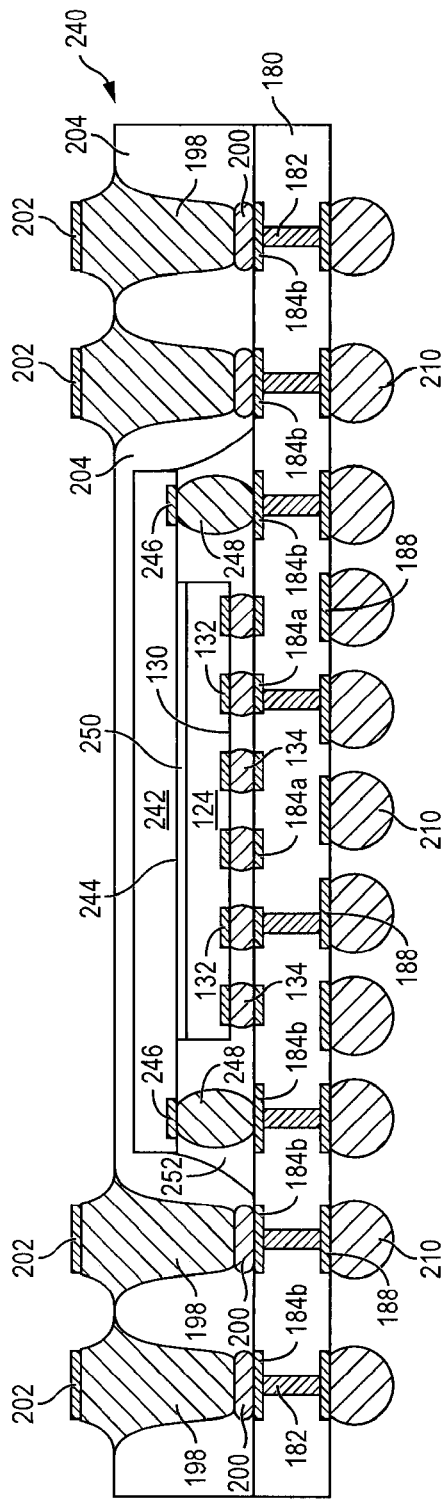
FIG. 9 illustrates the Fo-WLCSP with a leadframe interposer disposed over stacked semiconductor die and BT laminate PCB for vertical electrical interconnect.

FIG. 9 shows an embodiment of Fo-WLCSP 240, similar to FIGS. 7a-7h, with stacked semiconductor die embedded within encapsulant 204. Semiconductor die 242 has an active surface 244 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 244 to implement analog circuits or digital circuits, such as DSP, ASIC, memory, or other signal processing circuit. Semiconductor die 222 may also contain IPDs, such as inductors, capacitors, and resistors, for RF signal processing. In one embodiment, semiconductor die 242 is a flipchip type semiconductor die. Contact pads 246 are formed on active surface 244 and electrically connected to the circuits on the active surface. A plurality of bumps 248 is formed over contact pads 226.

Semiconductor die 242 is mounted active surface-to-back surface to semiconductor die 124 with b-stage coating 250, prior to mounting leadframe 194 in FIGS. 7d-7e. Bumps 248 are metallurgically and electrically connected to conductive layer 184b. An optional underfill material 252 is deposited under semiconductor die 124 and 242. Encapsulant 204 covers semiconductor die 124 and 242, as described in FIG. 7f. Base leads 198, PCB 180, and bumps 210 provide z-direction vertical electrical interconnect for semiconductor die 124 and 242, as described in FIGS. 7g-7h.

Figure 10:
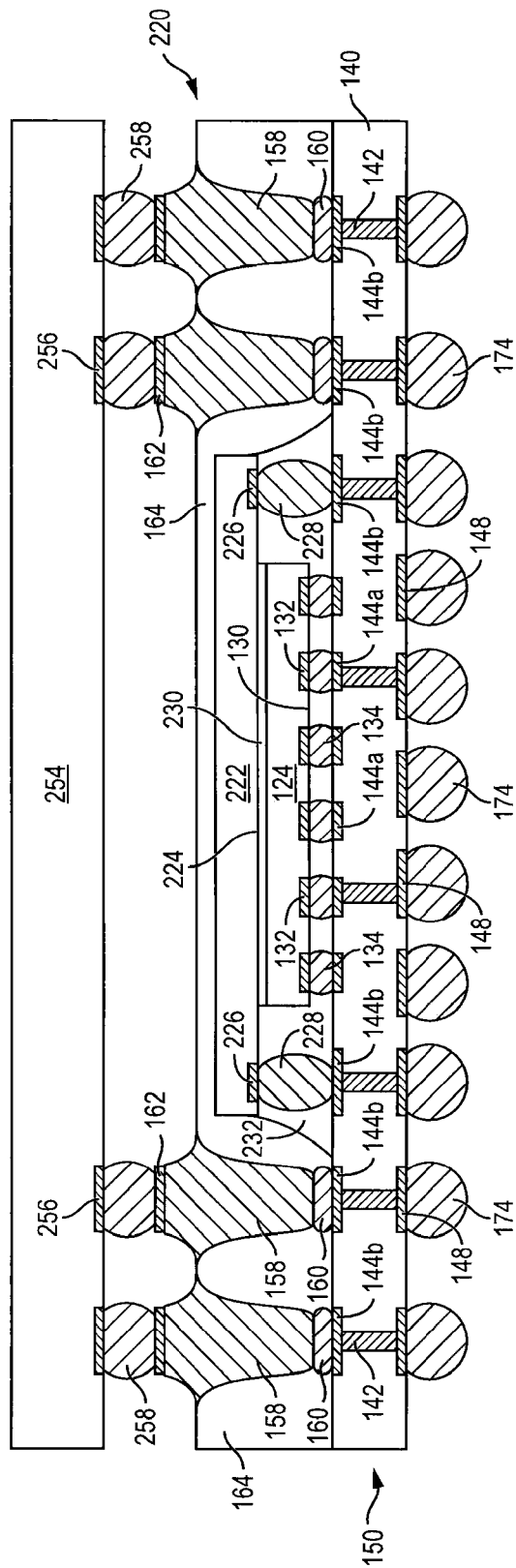
FIG. 10 illustrates a semiconductor die or component mounted for the Fo-WLCSP.
Figure 11:
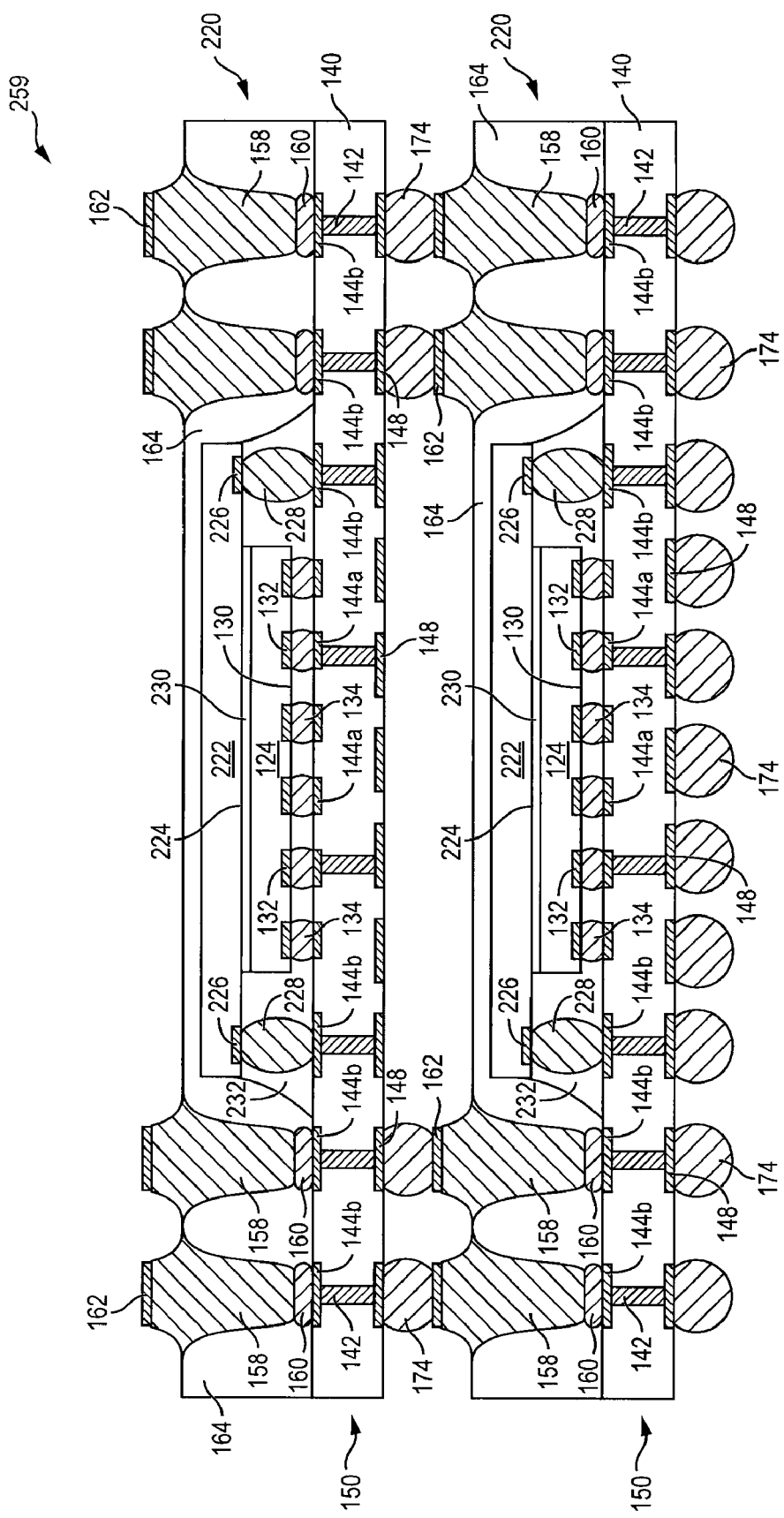
FIG. 11 illustrates two stacked Fo-WLCSP electrically connected with the leadframe interposer.

FIG. 10 shows a semiconductor package or component 254 mounted to conductive layer 162 of Fo-WLCSP 220. Semiconductor package or component 254 has contact pads 256 with bumps 258 formed over the contact pads. Semiconductor package or component 254 is electrically connected to Fo-WLCSP 220 through bumps 258, conductive layer 162, base leads 158, and TSV substrate 150. Semiconductor package or component 254 can be any integrated semiconductor die, discrete active or passive semiconductor component, or semiconductor package, e.g., package-on-package (PoP), embedded solder-on-pad (ESOP), or package-on-package bottom (PoPb). As one example, FIG. 11 shows an upper Fo-WLCSP 220 mounted to a lower Fo-WLCSP 220 as PoP 259.

Figure 12:
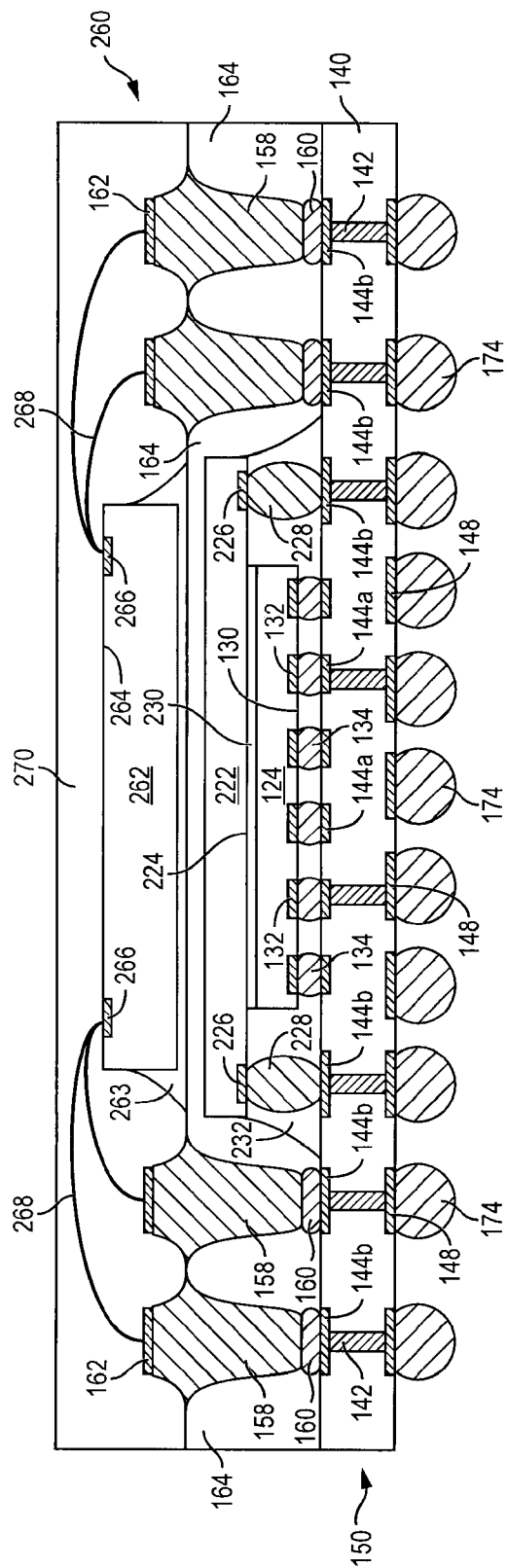
FIG. 12 illustrates a wire-bond semiconductor die stacked over the Fo-WLCSP.

FIG. 12 shows an embodiment of PoP 260, similar to FIG. 8, with a wire-bond semiconductor die 262 mounted to encapsulant 164 of Fo-WLCSP 220 with die attach adhesive 263. Semiconductor die 262 has an active surface 264 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 264 to implement analog circuits or digital circuits, such as DSP, ASIC, memory, or other signal processing circuit. Semiconductor die 262 may also contain IPDs, such as inductors, capacitors, and resistors, for RF signal processing. Contact pads 266 are formed on active surface 264 and electrically connected to the circuits on the active surface. A plurality of bond wires 268 is formed between contact pads 266 and conductive layer 162.

An encapsulant or molding compound 270 is deposited over semiconductor die 262 and Fo-WLCSP 220 using a paste printing, compressive molding, transfer molding, liquid encapsulant molding, vacuum lamination, spin coating, or other suitable applicator. Encapsulant 270 can be polymer composite material, such as epoxy resin with filler, epoxy acrylate with filler, or polymer with proper filler. Encapsulant 270 is non-conductive and environmentally protects the semiconductor device from external elements and contaminants.

Figure 13:
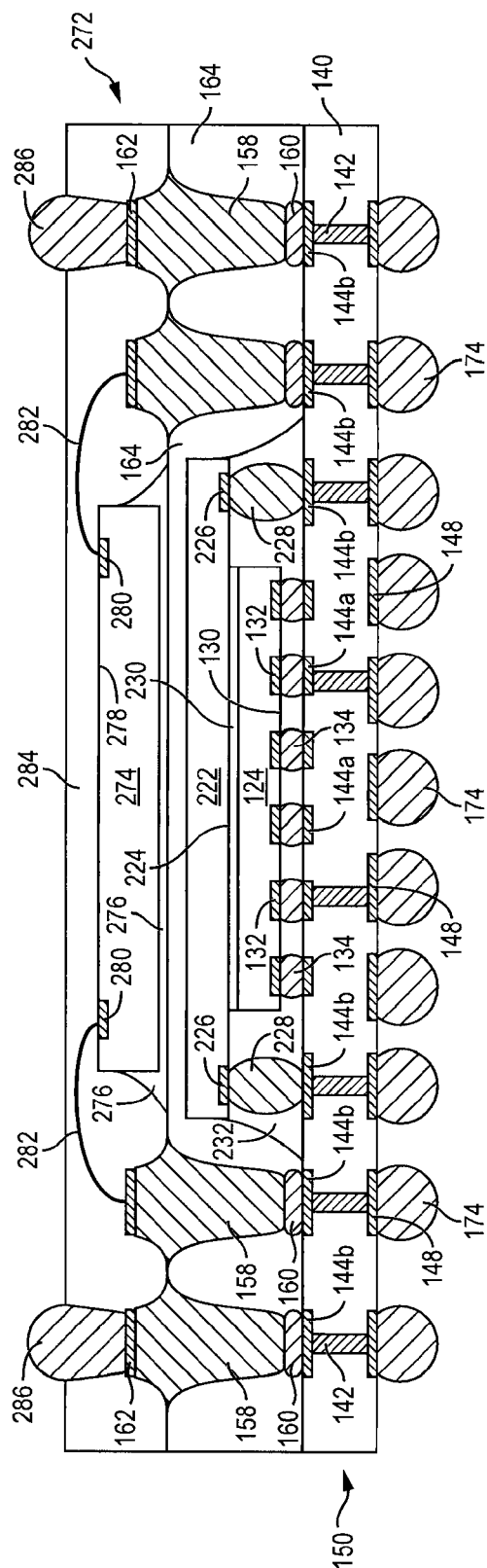
FIG. 13 illustrates another wire-bond semiconductor die stacked over the Fo-WLCSP.

FIG. 13 shows an embodiment of PoP 272, similar to FIG. 8, with a wire-bond semiconductor die 274 mounted to encapsulant 164 of Fo-WLCSP 220 with die attach adhesive 276. Semiconductor die 274 has an active surface 278 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 278 to implement analog circuits or digital circuits, such as DSP, ASIC, memory, or other signal processing circuit. Semiconductor die 274 may also contain IPDs, such as inductors, capacitors, and resistors, for RF signal processing. Contact pads 280 are formed on active surface 278 and electrically connected to the circuits on the active surface. A plurality of bond wires 282 is formed between contact pads 280 and conductive layer 162.

An encapsulant or molding compound 284 is deposited over semiconductor die 274 and Fo-WLCSP 220 using a paste printing, compressive molding, transfer molding, liquid encapsulant molding, vacuum lamination, spin coating, or other suitable applicator. Encapsulant 284 can be polymer composite material, such as epoxy resin with filler, epoxy acrylate with filler, or polymer with proper filler. Encapsulant 284 is non-conductive and environmentally protects the semiconductor device from external elements and contaminants. A portion of encapsulant 284 is removed by an etching process to expose conductive layer 162. Bumps 286 are formed over the exposed conductive layer 162.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate having a plurality of conductive vias formed through the substrate and first conductive layer formed over the substrate;
   mounting a first semiconductor die over the substrate;
   providing a leadframe having a base plate and a plurality of base leads extending from the base plate;
   forming an etch-resistant conductive layer over a surface of the base plate opposite the base leads;
   mounting the leadframe to the substrate over the first semiconductor die;
   depositing an encapsulant over the substrate and first semiconductor die;
   removing the base plate while retaining the etch-resistant conductive layer and portion of the base plate opposite the base leads to electrically isolate the base leads; and
   forming an interconnect structure over a surface of the substrate opposite the base leads.

2. The method of claim 1, further including mounting a second semiconductor die over the first semiconductor die prior to mounting the leadframe.

3. The method of claim 1, further including depositing an underfill material under the first semiconductor die.

4. The method of claim 1, further including:
   forming a window in the base plate; and
   depositing the encapsulant through the window.

5. The method of claim 1, further including:
   forming an opening in the base plate; and
   depositing the encapsulant through the opening.

6. The method of claim 1, wherein the substrate includes a bismaleimide/triazine laminate and epoxy resin.

7. A method of making a semiconductor device, comprising:
   providing a substrate;
   mounting a first semiconductor die over the substrate;
   providing an interposer having a base plate and a plurality of base leads extending from the base plate;
   forming a conductive layer over a surface of the base plate opposite the base leads;
   mounting the interposer to the substrate over the first semiconductor die;
   depositing an encapsulant over the substrate and first semiconductor die; and
   removing the base plate while retaining the conductive layer and portion of the base plate opposite the base leads to electrically isolate the base leads.

8. The method of claim 7, further including forming an interconnect structure over a surface of the substrate opposite the base leads.

9. The method of claim 7, further including mounting a second semiconductor die over the first semiconductor die prior to mounting the interposer.

10. The method of claim 7, further including mounting a second semiconductor die or component over the encapsulant electrically connected to the conductive layer and base leads.

11. The method of claim 10, wherein the second semiconductor die or component includes a wire-bond semiconductor die.

12. The method of claim 7, further including:
    forming a window in the base plate; and
    depositing the encapsulant through the window.

13. The method of claim 7, wherein the conductive layer includes an etch-resistant material.

14. A method of making a semiconductor device, comprising:
    providing a first substrate;
    disposing a first semiconductor die over the first substrate;
    providing a second substrate including a base plate and a plurality of base leads extending from the base plate;
    forming a conductive layer over a surface of the base plate opposite the base leads;
    disposing the second substrate over the first substrate and first semiconductor die;
    depositing an encapsulant over the first substrate and first semiconductor die; and
    removing a first portion of the base plate while retaining a second portion of the base plate opposite the base leads to electrically isolate the base leads.

15. The method of claim 14, wherein the conductive layer includes an etch-resistant material.

16. The method of claim 14, further including forming an interconnect structure over a surface of the first substrate opposite the base leads.

17. The method of claim 14, further including disposing a second semiconductor die over the first semiconductor die.

18. The method of claim 14, further including disposing a second semiconductor die or component over the encapsulant electrically connected to the base leads.

19. The method of claim 18, wherein the second semiconductor die or component includes a wire-bond semiconductor die.

20. A method of making a semiconductor device, comprising:
    providing a first substrate;
    disposing a first semiconductor die over the first substrate;
    providing a second substrate including a base plate and a plurality of base leads extending from the base plate;
    forming an etch-resistant material over a surface of the base plate opposite the base leads;
    disposing the second substrate over the first substrate and first semiconductor die; and removing a portion of the base plate outside the etch-resistant material to electrically isolate the base leads.

21. The method of claim 20, further including removing a portion of the base plate outside the etch-resistant material to electrically isolate the base leads.

22. The method of claim 20, further including depositing an encapsulant over the first substrate and first semiconductor die.

23. The method of claim 22, further including disposing a second semiconductor die or component over the encapsulant.

24. The method of claim 23, wherein the second semiconductor die or component includes a wire-bond semiconductor die.

25. The method of claim 22, further including:
forming an opening in the base plate; and
depositing the encapsulant through the opening.

26. The method of claim 22, further including:
forming a window in the base plate; and
depositing the encapsulant through the window.

27. The method of claim 20, further including forming an interconnect structure over a surface of the first substrate opposite the base leads.

28. The method of claim 20, further including disposing a second semiconductor die over the first semiconductor die.

29. The method of claim 20, further including disposing a second semiconductor die over the base leads.

30. The method of claim 20, further including depositing an underfill material under the first semiconductor die.

31. The method of claim 20, further including:
stacking a plurality of semiconductor devices; and
electrically connecting the stacked semiconductor devices through the base leads and first substrate.

\* \* \* \* \*